United States Patent
Konigsburg et al.

(10) Patent No.: US 6,412,051 B1
(45) Date of Patent: Jun. 25, 2002

(54) SYSTEM AND METHOD FOR CONTROLLING A MEMORY ARRAY IN AN INFORMATION HANDLING SYSTEM

(75) Inventors: Brian R. Konigsburg; George McNeil Lattimore; John Stephen Muhich, all of Austin, TX (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 08/757,979

(22) Filed: Nov. 27, 1996

(51) Int. Cl.$^7$ ............................................... G06F 12/14
(52) U.S. Cl. ..................... 711/163; 711/128; 711/144
(58) Field of Search ...................... 395/182.03, 182.06, 395/183.18; 711/163, 144, 128, 152

(56) References Cited

U.S. PATENT DOCUMENTS

| | | | | |
|---|---|---|---|---|
| 4,996,641 A | * | 2/1991 | Talgam | 711/118 |
| 5,019,971 A | * | 5/1991 | Lefsky | 395/182.03 |
| 5,666,482 A | * | 9/1997 | McClure | 395/182.06 |
| 5,671,229 A | * | 9/1997 | Harai | 371/10.2 |
| 5,701,431 A | * | 12/1997 | Whittaker | 711/128 |
| 5,708,789 A | * | 1/1998 | McClure | 711/3 |
| 5,729,677 A | * | 3/1998 | Wu | 395/183.18 |

OTHER PUBLICATIONS

Handy, J., The Cache Memory Book, ISBN 0–12–322985–5, pp. 158–161, 1993.*

* cited by examiner

Primary Examiner—Hiep T. Nguyen
(74) Attorney, Agent, or Firm—Kelly K. Kordzik; Winstead Sechrest & Minick P.C.; Casimer K. Salys

(57) ABSTRACT

A system and method for allowing operation of a storage array after a failure within a set of an n-way set associative cache includes determining that there is a failure in a bit line in the storage array, setting a flag to inhibit access to the portion of the array accessed by the failing entity and storing and retrieving data from remaining portions of the array. The present invention is well adapted for use with n-way set associative cache storage arrays.

9 Claims, 2 Drawing Sheets

SYSTEM AND METHOD FOR CONTROLLING A MEMORY ARRAY IN AN INFORMATION HANDLING SYSTEM

BACKGROUND OF THE INVENTION

1. Field of the Invention

The present invention relates to information handling systems and, more particularly, to control of access to data stored in memories in information handling systems.

2. Prior Art

Storage arrays in information handling systems are well-known in the art. As memory arrays get larger, it is beneficial to have data redundancy, word redundancy, and bit redundancy to increase effective yield and product reliability. In such large arrays, adding bit redundancy to word redundancy will generally result in increasing yield.

Adding redundancy at any level increases access time to reduce system performance. In general, word line redundancy is much simpler to implement and adds less access time to system performance than does bit line redundancy. Redundancy on larger memory elements is also possible.

Since redundancy adds to the delay of the array, the fastest, or peak, performance of the array is not attainable. However, the yield reliability of the memory is significantly increased. In a storage array having a large number of memory cells, even if memory has no defect, a performance penalty is still paid with prior art systems.

It is difficult to implement bit line redundancy when the data width of an array output in number of bits is large. For example, memory arrays may vary in the bit width of the outputs in the following increments: 1, 4, 8, 9, 16, 18, 32, and 36 bits wide. As the width of the memory output gets larger, it becomes increasingly difficult to multiplex the extra, or redundant, bits into any one of the outputs.

Another alternative is to have redundant bits associated uniquely with each output of the array such that if two redundant bits per output were added for a 36-bit-wide memory array, the area of the memory would increase by 1/n where n is the number of sets. Adding additional bits significantly increases the cost of the memory array.

In addition to the costs of adding area to an array, multiplexing adds additional time to memory access.

These problems are compounded for set associative cache arrays where multiple data are stored as different sets. For example, a four-way set associative cache accesses four separate data locations. It is not uncommon for set associative cache arrays to have wider outputs beyond 36 bits. Therefore, to add bit line redundancy to such set associative cache arrays would either add so much area to the array as to increase the cost beyond the benefit of increasing yield, or it would add additional access time which would effectively reduce performance of the system.

SUMMARY OF THE INVENTION

A system and method for allowing operation. of a storage array after a failure includes determining that there is a failure in the storage array, setting a flag to inhibit access to the portion of the array including the failure and storing and retrieving data from remaining portions of the array.

The present invention is well adapted for use with n-way set associative cache storage arrays.

It is an advantage of the present invention that a storage array such as a set associative cache array may be continued to be used for storage and retrieval of information, even in the event of a failure, by setting a flag to inhibit access to the portion of the array in which the failure occurred and allowing continued operation of the remaining, nonfailing portion of the array. Also, reliability is increased for the memory.

DETAILED DESCRIPTION OF A PREFERRED EMBODIMENT OF THE INVENTION

It is very common in state-of-the-art information handling systems to include one or more cache memory arrays for rapid access to data by processors to improve performance of the information handling system.

Figure 1:
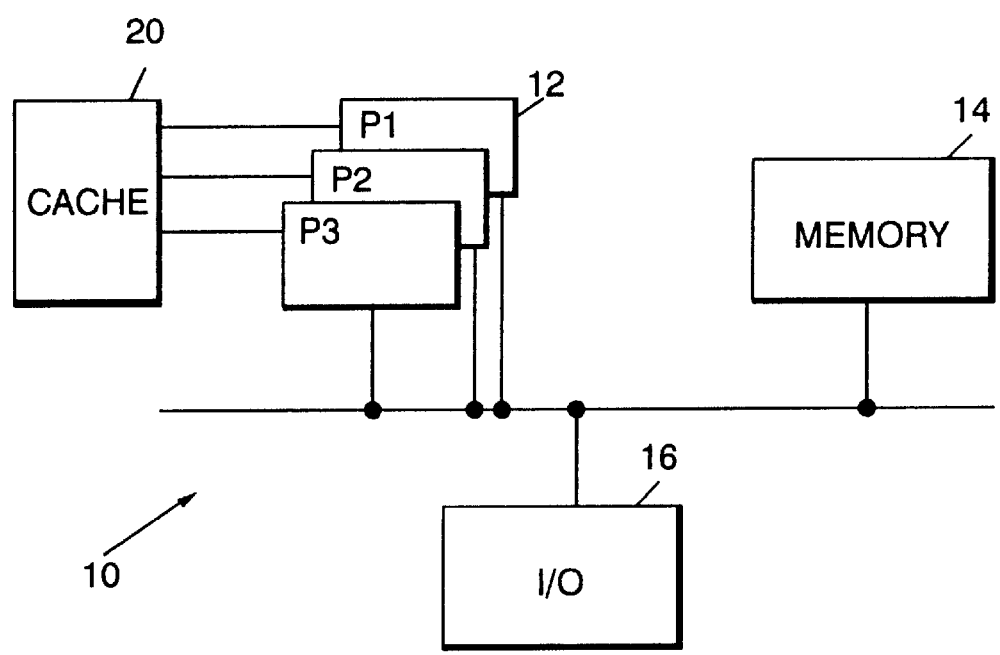
FIG. 1 is a block diagram of an information handling system embodying the present invention.

Referring now to FIG. 1, an information handling system embodying the present invention will be described. Information handling system 10 includes one or more processors 12 which, in a multi-processing system, might be identified as P1, P2, P3, etc., a main memory system 14, an input/output system 16, all connected by a system bus 18. Additionally, one or more cache memory arrays 20 might be directly connected to processors 12 for rapid access to data. Cache memory arrays 20 may be shared, dedicated, on processor chip or off processor chip without varying from the present invention.

Figure 2:
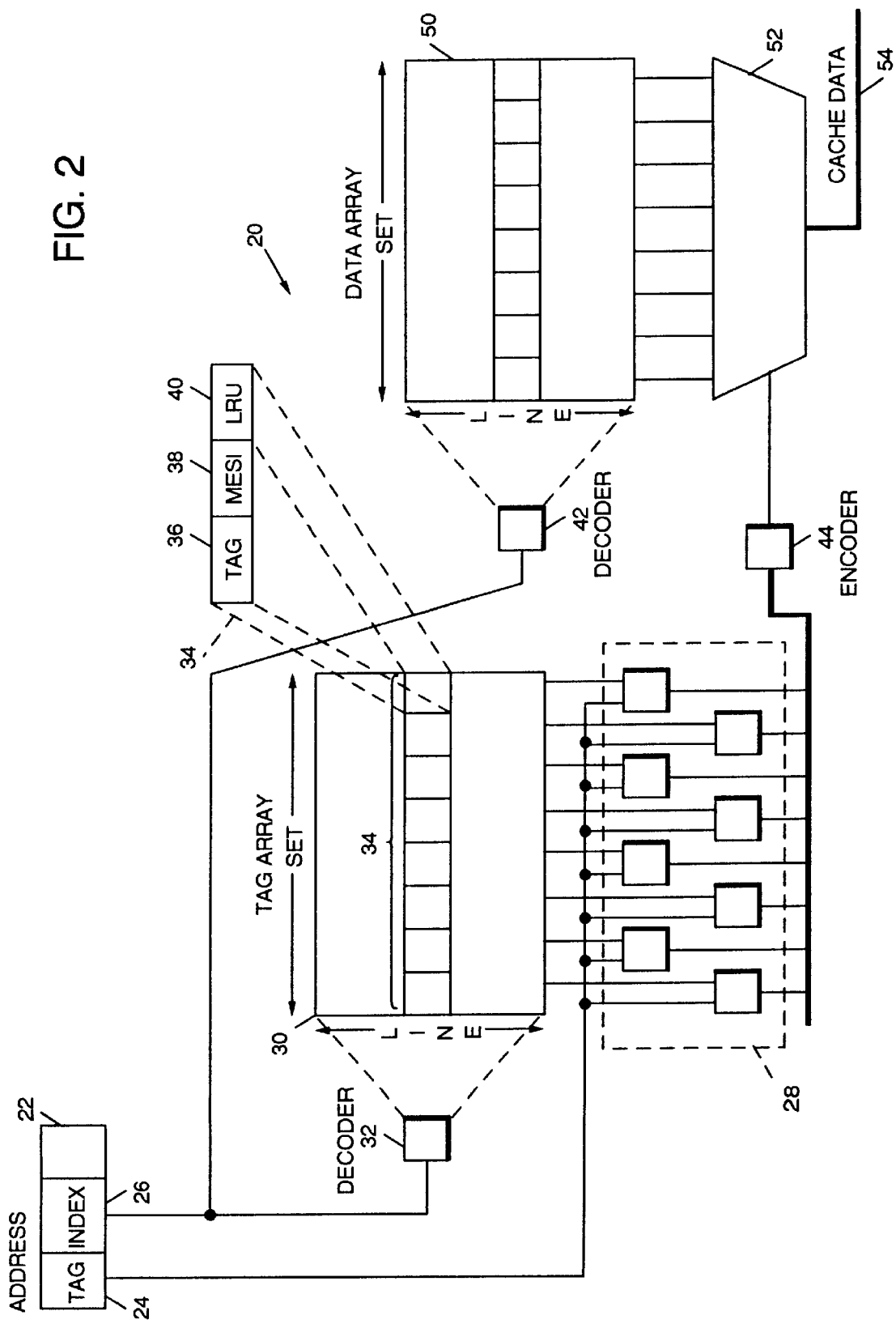
FIG. 2 is a block diagram of a set associative cache memory array embodying the present invention.

Referring now to FIG. 2, cache memory array 20 of information handling system 10 will be described in greater detail.

For the purposes of the description of the preferred embodiment of the present invention, cache memory array 20 will be described as a set associative cache array. Cache 20 includes two arrays, a tag array 30 and a data array 50. An address 22, including a tag portion 24 and an index portion 26, is presented to cache 20 for selection of a cache line for storage or retrieval of data in data array 50. The tag bit outputs from address 22 are connected to respective inputs to a comparator 28 wherein address information from tag array 30 is compared with the tag portion 24 of address 22. Comparator 28 includes a number of XOR circuits, there being one XOR circuit for each tag bit in address 22. The output bits from the index portion 26 of address 22 are connected to decoder 32 for selecting one line of many stored in tag array 30. Each line in tag array 30 includes a number of set fields 34, with each set field 34 including a tag portion 36 an MESI field 38 and a least recently used (LRU) field 40. Tag field 36 for. the selected line is output to comparator 28 to be compared with the tag portion 24 of the input address 22 to determine if there is a match between a desired line, as indicated by address 22, and the contents of array 20, as indicated by tag fields 36 in tag array 30.

The MESI field 38 stores flags for indicating that a particular line has either been Modified, is Exclusive, is Shared, or is Invalid. The Invalid flag of MESI field 38, as applied to the present invention, is used to inhibit access to a cache set for which one or more failures have been determined.

Thus, for example, in an eight-way set associative cache, one set of the cache would be disabled while the other seven sets of the cache would be allowed to be used, thereby permitting access to seven-eighths (⅞) of the array at normal system speed. Although the usable size of the array has been decreased due to the cache array failure or failures, the cache may still be used by processors 12 as intended.

Index field 26 of address 22 is also connected to a second decoder 42 which decodes line selection information for data array 50. The data for the selected line from data array 50 is output from array 50 to inputs of multiplexor 52 where a selected set data is gated as cache data out on line 54 under the control of encoder 44 which encodes the outputs of comparator 28.

If the Invalid flag in MESI field 38 is on, for example, a corresponding set of data in data array 50 would be inhibited and not passed through multiplexor 52 to the cache data out lines 54.

Thus, by using the Invalid bit in the MESI field 38, failing bit lines may be inhibited while a remainder of the cache array 20 is used effectively for data storage and retrieval.

Although the preferred embodiment of the present invention has been described with respect to bit line failures which would cause the inhibiting of data access from one set of an n-way set associative cache array, failures in other bit lines of the array could also be dealt with in a similar manner such that in an eight-way set associative cache, invalid bits in the MESI field 38 could be set to inhibit access of data from additional sets for added flexibility.

Although the present invention and its advantages have been described in detail, it should be understood that various changes, substitutions and alterations can be made herein without departing from the spirit or scope of the invention as defined in the appended claims.

What is claimed is:

1. A method for controlling operation of a storage array after a failure comprising the steps of:

identifying a failing element in the storage array, wherein said failing element is a memory bit line;

setting a flag to inhibit access to a portion of the array accessed by the failing element, wherein the step of setting the flag comprises the step of setting the Invalid bit in the MESI field of a cache line in the storage array, and storing to and retrieving data from remaining portions of the array.

2. A method according to claim 1, wherein the storage array is a set associative array having a plurality of sets of data stored therein.

3. A method according to claim 1, further comprising the step of:

inhibiting access to lines in the storage array in which a failure has been identified.

4. A method for controlling operation of a storage array after a failure comprising the steps of:

identifying a failing element in the storage array, wherein said failing element is a memory word line;

setting a flag to inhibit access to a portion of the array accessed by the failing element, wherein the step of setting the flag comprises the step of setting the Invalid bit in the MESI field of a cache line in the storage array; and storing to and retrieving data from remaining portions of the array.

5. A system for controlling operation of a storage array after a failure comprising:

means for identifying a failing element in the storage array, wherein said failing element is a memory word line;

means for setting a flag to inhibit access to a portion of the array accessed by the failing element, wherein the means for setting a flag comprises means for setting an Invalid bit within a MESI field of a cache line in the storage array; and means for storing to and retrieving data from remaining portions of the array.

6. A system according to claim 5, wherein the storage array is a set associative array having a plurality of sets of data stored therein.

7. A system according to claim 5, further comprising:

means for inhibiting access to lines in the storage array in which a failure has been identified.

8. A system for controlling operation of a storage array after a failure comprising:

means for identifying a failing element in the storage array, wherein said failing element is a memory bit line;

means for setting a flag to inhibit access to a portion of the array accessed by the failing element, wherein the means for setting a flag comprises means for setting an Invalid bit within a MESI field of a cache line in the storage array; and means for storing to and retrieving data from remaining portions of the array.

9. A cache array comprising:

a data array;

a tag array corresponding to the data array;

circuitry for receiving an address for selection of a cache line for storage or retrieval of data in the data array, wherein the address includes a tag portion and an index portion;

a comparator coupled to the tag array and operable for comparing address information from the tag array with the tag portion of the received address;

a first decoder coupled to the tag array and operable for selecting a cache line within the tag array in response to receipt of the index portion of the address;

a second decoder coupled to the data array and operable for selection of a cache line from the data array in response to receipt of the index portion of the address; and a multiplexer having inputs coupled to outputs from the data array and operable for selecting data from the data array in response to receipt of an encoded output of the comparator, wherein each cache line in the tag array includes a MESI field operable for storing flags indicating that a particular cache line has either been Modified, is Exclusive, is Shared, or is Invalid, wherein the Invalid flag is used to inhibit access to a cache set for which one or more failures have been determined.

* * * * *

UNITED STATES PATENT AND TRADEMARK OFFICE
CERTIFICATE OF CORRECTION

PATENT NO.      : 6,412,051 B1
DATED           : June 25, 2002
INVENTOR(S)  : Konigsburg et al.

It is certified that error appears in the above-identified patent and that said Letters Patent is hereby corrected as shown below:

Title page,
Item [*] Notice, delete "0" and insert -- 628 --.

Signed and Sealed this

Twenty-third Day of August, 2005

JON W. DUDAS
*Director of the United States Patent and Trademark Office*